(12) United States Patent
Kai

(10) Patent No.: US 10,388,625 B2
(45) Date of Patent: Aug. 20, 2019

(54) PRESS FITTING HEAD AND SEMICONDUCTOR MANUFACTURING APPARATUS USING THE SAME

(71) Applicant: J-DEVICES CORPORATION, Oita (JP)

(72) Inventor: Minoru Kai, Yokohama (JP)

(73) Assignee: J-Devices Corporation, Oita (JP)

( * ) Notice: Subject to any disclaimer, the term of this patent is extended or adjusted under 35 U.S.C. 154(b) by 311 days.

(21) Appl. No.: 15/290,557

(22) Filed: Oct. 11, 2016

(65) Prior Publication Data

US 2017/0110432 A1 Apr. 20, 2017

(30) Foreign Application Priority Data

Oct. 15, 2015 (JP) .................. 2015-203884

(51) Int. Cl.
*H01L 21/68* (2006.01)
*H01L 21/67* (2006.01)
*H01L 23/00* (2006.01)

(52) U.S. Cl.
CPC ........ *H01L 24/75* (2013.01); *H01L 21/67132* (2013.01); *H01L 21/67144* (2013.01); *H01L 21/681* (2013.01); *H01L 24/27* (2013.01); *H01L 24/29* (2013.01); *H01L 24/32* (2013.01); *H01L 24/83* (2013.01); *H01L 2224/27436* (2013.01); *H01L 2224/2919* (2013.01); *H01L 2224/32225* (2013.01); *H01L 2224/32245* (2013.01); *H01L 2224/7532* (2013.01); *H01L 2224/75312* (2013.01); *H01L 2224/75316* (2013.01); *H01L 2224/75702* (2013.01); *H01L 2224/75745* (2013.01); *H01L 2224/75753* (2013.01); *H01L 2224/75822* (2013.01); *H01L 2224/75824* (2013.01); *H01L 2224/8313* (2013.01); *H01L 2224/8317* (2013.01); *H01L 2224/8318* (2013.01); *H01L 2224/83132* (2013.01); *H01L 2224/83191* (2013.01)

(58) Field of Classification Search
CPC . H01L 24/75; H01L 21/681; H01L 21/67132; H01L 21/67144; H01L 2224/2919; H01L 2224/8317; H01L 2224/83191; H01L 2224/75745; Y10T 29/53087
USPC .......... 257/718, 746; 385/88, 92; 174/140 S; 264/297.2; 29/720
See application file for complete search history.

(56) References Cited

U.S. PATENT DOCUMENTS

2005/0161837 A1\* 7/2005 Matsui .................. H01L 23/481
257/797

FOREIGN PATENT DOCUMENTS

| JP | H9-309085 A | 12/1997 |
|---|---|---|
| JP | 2005-217071 A | 8/2005 |
| JP | 2010-283010 A | 12/2010 |
| JP | 2011086698 | 4/2011 |
| JP | 2014-179561 A | 9/2014 |

\* cited by examiner

*Primary Examiner* — Bayan Salone

(57) ABSTRACT

A press fitting head comprising an elastic member in a part where the press fitting head contacts a semiconductor device, and an alignment mark recognition area capable of detecting an optically readable marker provided on a surface to be contacted to the semiconductor device is provided. Additionally, a semiconductor manufacturing apparatus in which the press fitting head is applied is provided.

5 Claims, 6 Drawing Sheets

PRESS FITTING HEAD AND SEMICONDUCTOR MANUFACTURING APPARATUS USING THE SAME

CROSS REFERENCE TO RELATED APPLICATIONS

This application is based on and claims the benefit of priority from the prior Japanese Patent Application No. 2015-203884, filed on Oct. 15, 2015, the entire contents of which are incorporate herein by reference.

FIELD

The present invention relates to a press fitting head which sucks a semiconductor device and a semiconductor manufacturing apparatus using the same. In particular, the present invention relates to a press fitting head which realizes a high-accuracy die attach of a semiconductor device and a semiconductor manufacturing apparatus using the same.

BACKGROUND

In general, a die attach apparatus which takes a semiconductor device out of a diced wafer and mounts the semiconductor device on a mounting body such as a lead frame and a substrate recognizes a feature pattern provided on a contour or a surface layer of the semiconductor device. The die attach apparatus recognizes the feature pattern provided on the semiconductor device at the time that the apparatus individually takes out the supplied semiconductor devices or at the time that the apparatus puts the semiconductor device on an intermediate stage used in the process for transferring the semiconductor devices to a press fitting unit (hereinafter referred to as fitting unit) which mounts the semiconductor devices on the mounting body. The die attach apparatus corrects the position of the semiconductor devices based on the feature pattern, and then performs the die attach of the semiconductor devices on the mounting body. Such a die attach apparatus is disclosed in Japanese Patent Laid-Open No. 2005-217071, for example. The die attach apparatus does not recognize a feature pattern provided on a contour or a surface layer of the semiconductor device to correct the position of the semiconductor device after the fitting unit holds the semiconductor device. Also the die attach apparatus does not have a means for correcting a displacement caused by transferring the semiconductor device or by moving of the fitting unit to a position where the semiconductor device is mounted on the mounting body, while the fitting unit holds the semiconductor device. For this reason, this causes a problem in that the performances of the apparatus have limitations on accuracy that the semiconductor device is fitted to the surface to which the semiconductor device is mounted on the mounting body.

Additionally, Japanese Patent Laid-Open No. H9-309085 discloses a die attach apparatus provided with a fitting unit including a fitting part directly contacting the semiconductor device. The fitting part is formed of an elastic material so as to deform in accordance with the shape of the semiconductor device when the fitting unit fits and holds the semiconductor device. In the die attach apparatus, the fitting part directly contacting the semiconductor device deforms in accordance with the shape of the surface of the semiconductor device when the fitting unit contacts the semiconductor device, so that the fitting part is brought into close contact with the semiconductor device. However, the die attach apparatus has a problem that a feature pattern provided on a contour or a surface layer of a semiconductor device to correct a position cannot be recognized after the fitting unit holds the semiconductor device if the fitting part is formed of an opaque elastic material such as rubber, for example.

SUMMARY

A press fitting head according to an embodiment of the present invention includes an elastic member in a part where the press fitting head contacts a semiconductor device. Also the press fitting head includes an alignment mark recognition area capable of detecting an optically readable marker provided on a surface which is contacted to the semiconductor device.

In the press fitting head according to an embodiment of the present invention, the elastic member may have a notch portion in and the alignment mark recognition area may coincide with the notch portion.

In the press fitting head according to an embodiment of the present invention, the elastic member may have an opening portion and the alignment mark recognition area may coincide with the opening portion.

In the press fitting head according to an embodiment of the present invention, the opening portion may be coupled with a vacuum generator.

The press fitting head according to an embodiment of the present invention may further include a transparent fixing portion configured to fix the elastic member.

A semiconductor manufacturing apparatus according to an embodiment of the present invention includes: a fitting unit comprising a press fitting head including an elastic member in a part where the press fitting head contacts a semiconductor device, the press fitting head including an alignment mark recognition area capable of detecting a first optically readable marker provided on a surface to be contacted to the semiconductor device and a holding portion holding the press fitting head; and a control unit configured to recognize the first marker through the alignment recognition area and control the movement and rotation of the fitting unit on the basis of the position of the first marker.

In the semiconductor manufacturing apparatus according to an embodiment of the present invention, the elastic member may have a notch portion and the alignment mark recognition area may coincide with the notch portion.

In the semiconductor manufacturing apparatus according to an embodiment of the present invention, the elastic member may have an opening portion and the alignment mark recognition area may coincide with the opening portion.

In the semiconductor manufacturing apparatus according to an embodiment of the present invention, the press fitting head may have a first hollow portion and the holding portion may have a second hollow portion coupled with a vacuum generator at one end thereof and coupled with the first hollow portion at another end thereof.

In the semiconductor manufacturing apparatus according to an embodiment of the present invention, the holding portion may have a hollow portion coupled with a vacuum generator at one end thereof and coupled with the opening portion at another end thereof.

In the semiconductor manufacturing apparatus according to an embodiment of the present invention, the press fitting head further includes a transparent fixing portion configured to fix the elastic member and the first hollow portion may include a lower hollow portion provided in the elastic member and an upper hollow portion provided in the fixing portion and coupled with the lower hollow portion.

The semiconductor manufacturing apparatus according to an embodiment of the present invention may further include an imaging unit configured to capture the first maker. The control unit may recognize the position of the first marker on the basis of the image of the first marker captured by the imaging unit.

In the semiconductor manufacturing apparatus according to an embodiment of the present invention, the control unit may recognize a second marker provided on the surface of a substrate and controls the movement and rotation of the fitting unit on the basis of the position of the second marker.

DESCRIPTION OF EMBODIMENTS

Figure 1:
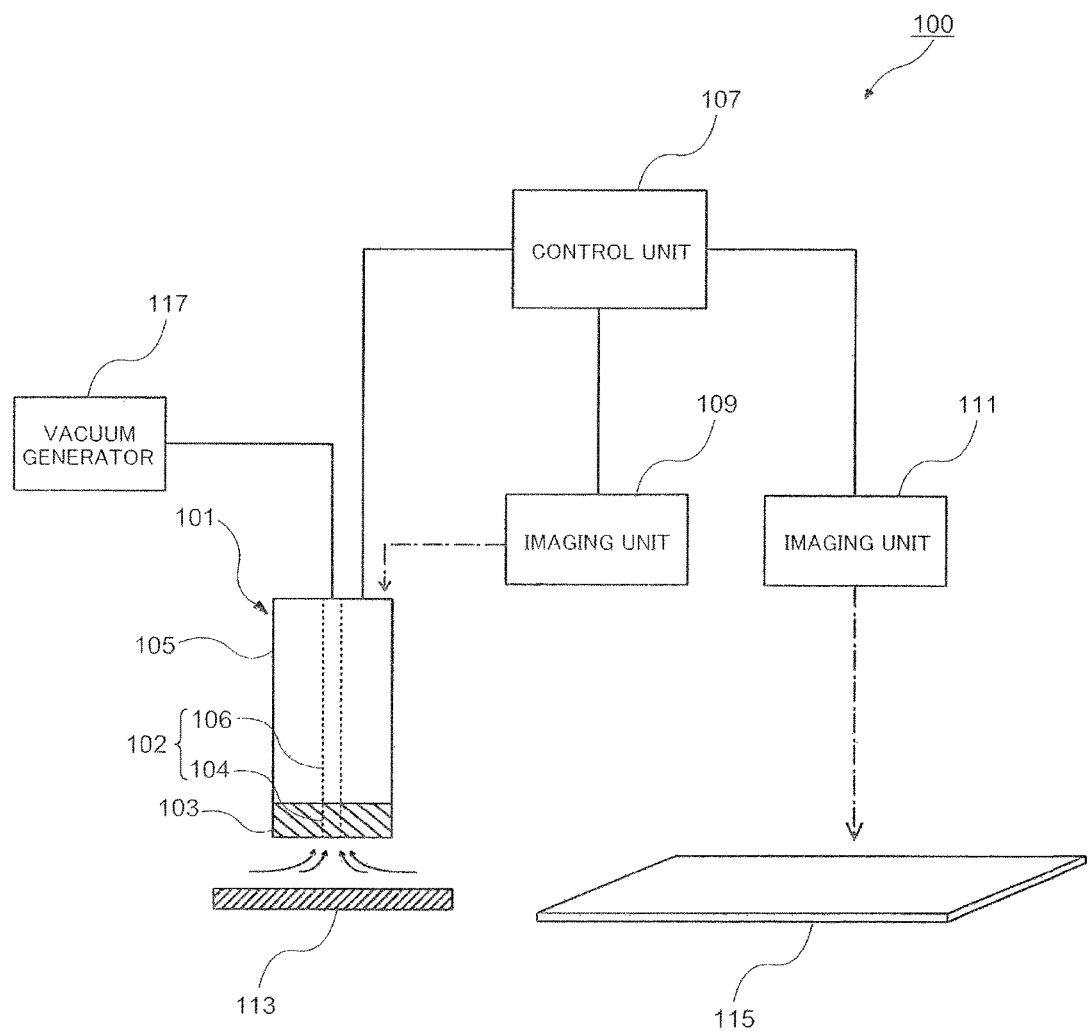
FIG. 1 is a block diagram showing a semiconductor manufacturing apparatus according to an embodiment of the present invention.

A semiconductor manufacturing apparatus according to the present invention is described below with reference to the following drawings. The semiconductor manufacturing apparatus according to the present invention can be implemented in a many different forms and is not construed as being limited to the description of the following embodiments. In the drawings referred in the present embodiments, the same reference symbols are given to the same parts or parts with similar functions to omit the repetitive descriptions. In the following description, if a certain element such as film, area, and others lies on, over, or above another element, this includes a case where further another element lies in its intermediate position irrespective of the case where the certain element lies immediately over or above another element.

If a transparent material such as glass or quartz, for example, is used in a press fitting part directly contacting the semiconductor device to enable the recognition of a feature pattern provided on a contour or a surface layer of the semiconductor device, the press fitting part does not deform when the semiconductor device is pressed and fitted to the fitting surface on the mounting body, so that it is difficult to perform fitting with the fitting surface on the mounting body and the entire surface of the semiconductor device kept in parallel and the corner of the semiconductor device is liable to rise upward to preclude stable fitting from being performed. Therefore, higher temperature/load are required as die attach conditions to maintain fitting performance. The press fitting part is made of a hard material to cause yield loss such as damage of the semiconductor device at the time of pressing and fitting the semiconductor device against and to the fitting surface on the mounting body in a case where a foreign matter is jammed between the press fitting part of the fitting unit and the fitting surface of the semiconductor device.

The present invention provides a semiconductor manufacturing apparatus capable of improving accuracy at which the semiconductor device is mounted on the fitting surface of the mounting body and of improving fitting performance between the fitting surface of the mounting body and the semiconductor device. Also the present invention provides a press fitting head used in the semiconductor manufacturing apparatus. An example of the press fitting head and the semiconductor manufacturing apparatus using the same according to the present invention is described below using embodiments.

A semiconductor manufacturing apparatus according to an embodiment of the present invention is described below with reference to FIGS. 1 to 5.

FIG. 1 is a block diagram showing a semiconductor manufacturing apparatus 100 according to an embodiment of the present invention. As shown in FIG. 1, the semiconductor manufacturing apparatus 100 includes a fitting unit 101, a control unit 107, a first imaging unit 109, and a second imaging unit 111.

The fitting unit 101 takes a semiconductor device 113 out of a diced wafer and holds it. The fitting unit 101 is provided with a hollow portion 102. The hollow portion 102 is coupled with a vacuum generator 117 such as a vacuum pump. Two or more hollow portions 102 may be provided. A die attach film or an adhesive is provided on a surface of the semiconductor device 113 which is fitted to the fitting surface of a mounting body 115.

The fitting unit 101 comprises a press fitting head 103 and a holding portion 105. The press fitting head 103 is provided with a first hollow portion 104 and sucks and holds the semiconductor device 113. The holding portion 105 holds the press fitting head 103. The holding portion 105 is provided with a second hollow portion 106 coupled with the vacuum generator 117 at one end thereof and coupled with the first hollow portion 104 at another end thereof. The first hollow portion 104 is coupled with the second hollow portion 106 to form the hollow portion 102. The fitting unit 101 moves the semiconductor device 113 in the direction of X, Y, and Z axes (front and back directions, left and right directions, and upward and downward directions) and rotates the semiconductor device 113 (on a horizontal plane). The semiconductor device 113 is vacuum-chucked by the press fitting head 103 coupled with the vacuum generator 117. The fitting unit 101 moves and rotates while sucking and holding semiconductor device 113 and corrects the position of the semiconductor device 113 with respect to the fitting surface of the mounting body 115 such as a substrate and a lead frame, thereafter, presses the semiconductor device 113 against the fitting surface of the mounting body 115 to mount the semiconductor device 113 on the fitting surface of the mounting body 115.

The press fitting head 103 has an elastic member in its portion contacting the semiconductor device 113. The elastic member has conductivity preferably. For example, the elastic member may be silicone rubber or acrylic rubber including a conductive filler such as carbon black. The conductive elastic member directly contacting the semiconductor device 113 can suppress charging on the surface of the semiconductor device 113 in sucking and holding the semiconductor device 113 to allow the semiconductor device 113 to be prevented from being damaged by electro-static discharge. The elastic member of the press fitting head 103 is provided with an alignment mark recognition area capable of detecting an optically readable marker (hereinafter referred to as first alignment mark) provided on the surface of the semiconductor device 113 contacting the press fitting head 103.

Figure 2A:
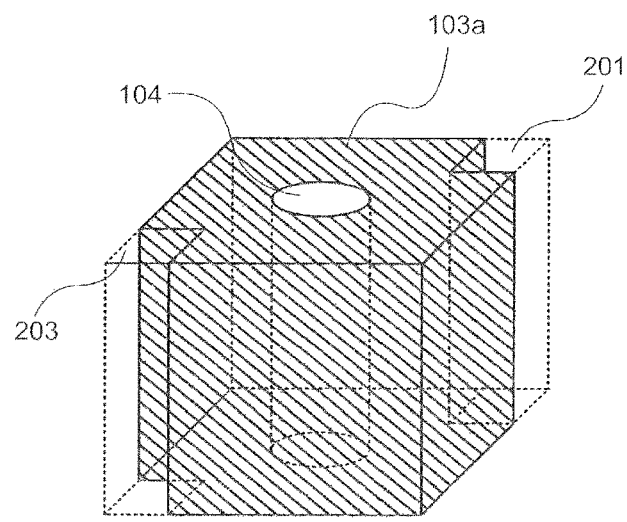
FIG. 2A is a schematic diagram showing an example of the press fitting head used in the semiconductor manufacturing apparatus according to an embodiment of the present invention.

FIG. 2A is a schematic diagram showing an example of the press fitting head 103 used in the semiconductor manufacturing apparatus 100. A press fitting head 103a shown in FIG. 2A is wholly composed of an elastic member. The press fitting head 103a includes the first hollow portion 104 and alignment recognition areas 201 and 203. The alignment recognition areas 201 and 203 are notch portions provided in the press fitting head 103a. In FIG. 2A, the alignment recognition areas 201 and 203 are rectangular, but the shape of the alignment recognition areas 201 and 203 is not limited to rectangularity. In FIG. 2A, the top view of the first hollow portion 104 is circular but not limited to circle.

Figure 2B:
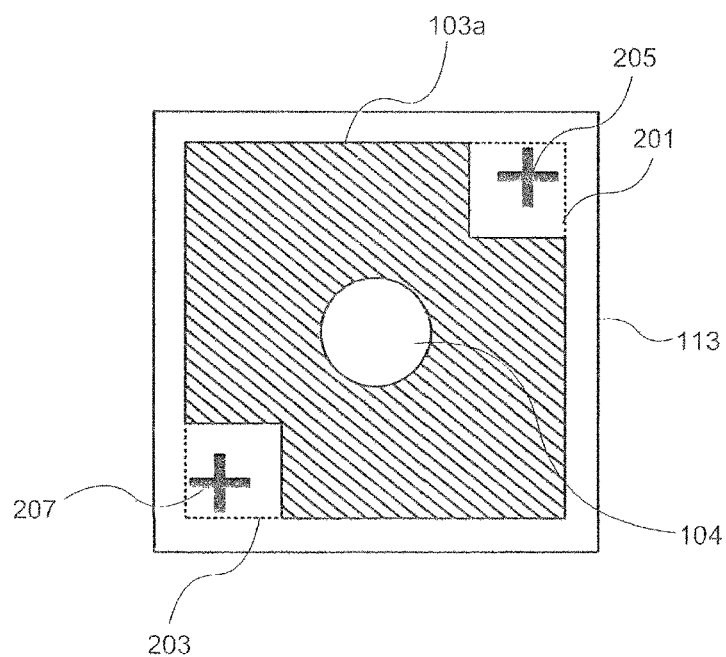
FIG. 2B is a top view of the press fitting head shown in FIG. 2A.

FIG. 2B is a top view showing that the press fitting head 103a shown in FIG. 2A. In FIG. 2B, the press fitting head 103a sucks and holds the semiconductor device 113. As shown in FIG. 2B, when the press fitting head 103a sucks and holds the semiconductor device 113, first alignment marks 205 and 207 provided on the surface of the semiconductor device 113 are exposed to allow the first imaging unit 109 described below to image the first alignment marks. FIG. 2B shows an example where two alignment marks 205 and 207 are provided on the surface of the semiconductor device 113, however, the number of the first alignment marks provided on the surface of the semiconductor device 113 is not limited to two, but, the number thereof has only to be at least one.

Figure 3A:
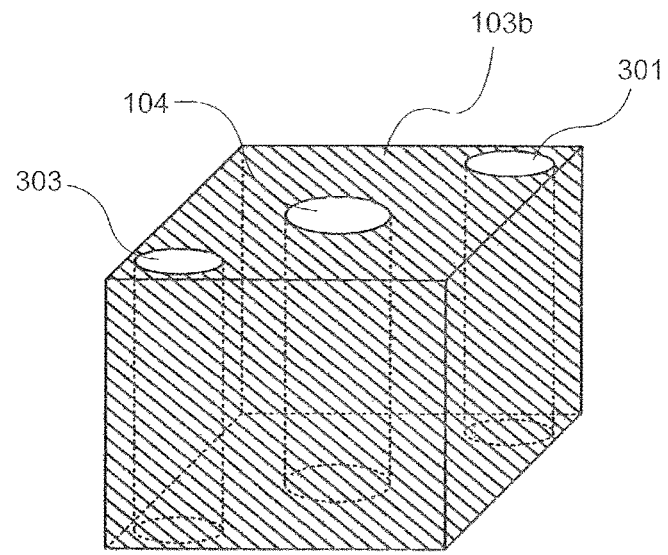
FIG. 3A is a schematic diagram showing an example of the press fitting head used in the semiconductor manufacturing apparatus according to an embodiment of the present invention.

FIG. 3A is a schematic diagram showing another example of the press fitting head 103 used in the semiconductor manufacturing apparatus 100. A press fitting head 103b shown in FIG. 3A is wholly composed of an elastic member. The press fitting head 103b includes the first hollow portion 104 and alignment recognition areas 301 and 303. The alignment recognition areas 301 and 303 are opening portions provided in the press fitting head 103b. In FIG. 3A, the top view of the opening portions (the alignment recognition areas) 301 and 303 is circular, but the top view of the opening portions (the alignment recognition areas) 301 and 303 is not limited to circle. In FIG. 3A, the top view of the first hollow portion 104 is circular but not limited to circle.

Figure 3B:
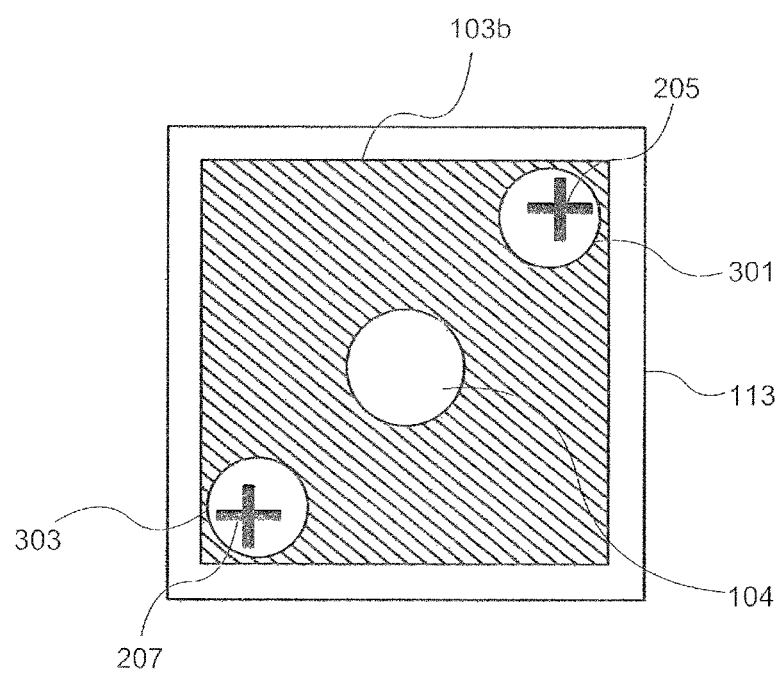
FIG. 3B is a top view of the press fitting head shown in FIG. 3A.

FIG. 3B is a top view showing that the press fitting head 103b shown in FIG. 3A. In FIG. 3B, the press fitting head 103b sucks and holds the semiconductor device 113. As shown in FIG. 3B, when the press fitting head 103b sucks and holds the semiconductor device 113, first alignment marks 205 and 207 provided on the surface of the semiconductor device 113 are exposed through alignment recognition areas 301 and 303 to allow the first imaging unit 109 described below to image the first alignment marks. FIG. 3B shows an example where two alignment marks 205 and 207 are provided on the surface of the semiconductor device 113, however, the number of the first alignment marks provided on the surface of the semiconductor device 113 is not limited to two, but, the number thereof has only to be at least one.

Figure 4A:
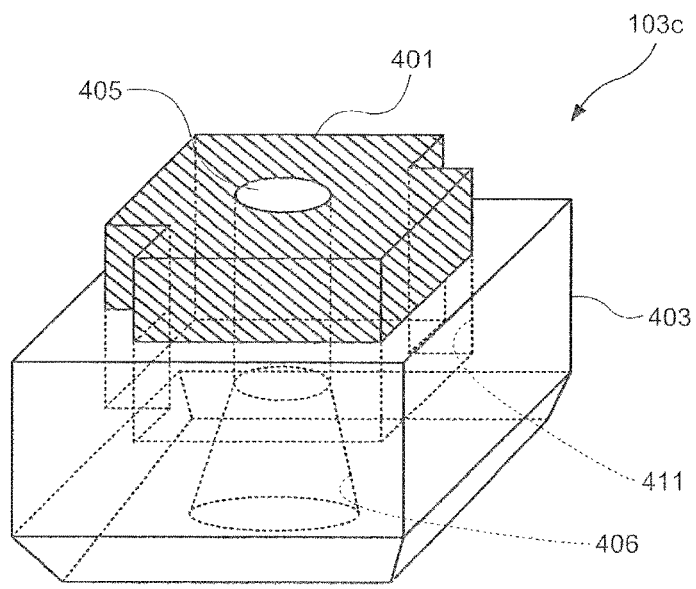
FIG. 4A is a schematic diagram showing an example of the press fitting head used in the semiconductor manufacturing apparatus according to an embodiment of the present invention.
Figure 4B:
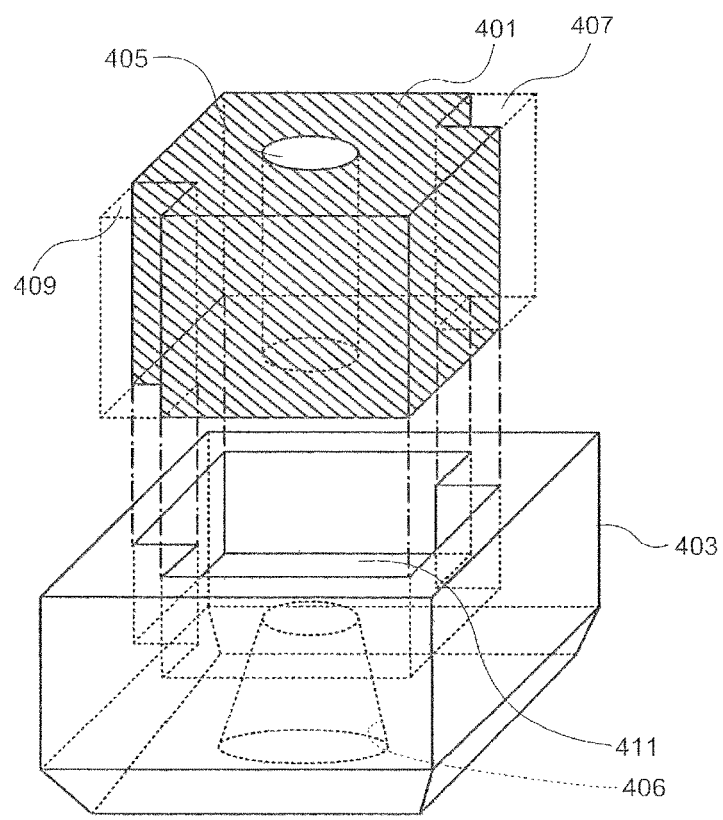
FIG. 4B is an exploded view of the press fitting head shown in FIG. 4A.

FIG. 4A is a schematic diagram showing another example of the press fitting head 103 used in the semiconductor manufacturing apparatus 100. FIG. 4B is an exploded view of the press fitting head shown in FIG. 4A. A press fitting head 103c shown in FIG. 4A includes a press fitting portion 401 and a fixing portion 403 having a fitting portion 411 into which the press fitting portion 401 is fitted.

The press fitting portion 401 directly contacts the semiconductor device 113 and is formed of an elastic member. As with the press fitting head 103a described with reference to FIGS. 2A and 2B, the press fitting portion 401 includes a lower hollow portion 405 and alignment recognition areas 407 and 409. The alignment recognition areas 407 and 409 are notch portions provided in the press fitting portion 401. As with the alignment recognition areas 201 and 203 in FIGS. 2A and 2B, the shape of the alignment recognition areas 407 and 409 is not limited to rectangularity. The press fitting portion 401 is partially fitted into the fitting portion 411 of a fixing portion 403 and fixed to the fixing portion 403. The lower hollow portion 405 is coupled with an upper hollow portion 406 of the fixing portion 403 described later.

The fixing portion 403 is formed of a transparent material and provided with the fitting portion 411 into which the press fitting portion 401 is partially fitted. The transparent material forming the fixing portion 403 may be glass or quartz, for example. The shape of the concave fitting portion 411 is set so as to match with the shape of the press fitting portion 401. The fixing portion 403 includes the upper hollow portion 406. The upper hollow portion 406 is coupled with the lower hollow portion 405 of the press fitting portion 401 at one end thereof and coupled with the second hollow portion 106 of the holding portion 105 at another end thereof. That is, the lower hollow portion 405 of the press fitting portion 401 is coupled together with the upper hollow portion 406 of the fixing portion 403 to form the first hollow portion 104. FIGS. 4A and 4B show an example where the upper hollow portion 406 of the fixing portion 403 is tapered from another end thereof coupled with the second hollow portion 106 to one end thereof coupled with the lower hollow portion 405 of the press fitting portion 401, but the shape of the upper hollow portion 406 of the fixing portion 403 is not always limited to a tapered shape. The fixing portion 403 does not directly contact the semiconductor device 113.

In the press fitting head 103c shown in FIGS. 4A and 4B, when the press fitting head 103c sucks and holds the semiconductor device 113, the first alignment mark provided on the surface of the semiconductor device 113 can be imaged by the first imaging unit 109 described below through the alignment recognition areas 407 and 409 and the fixing portion 403 made of the transparent material.

Figure 5A:
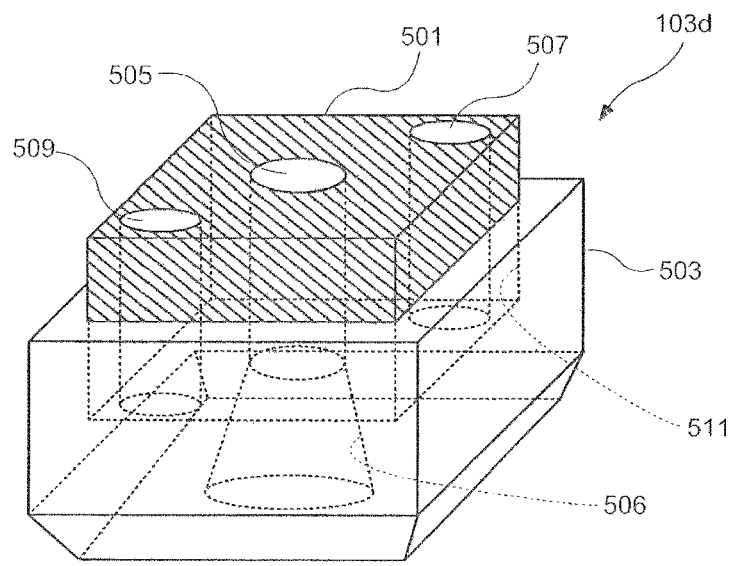
FIG. 5A is a schematic diagram showing an example of the press fitting head used in the semiconductor manufacturing apparatus according to an embodiment of the present invention.
Figure 5B:
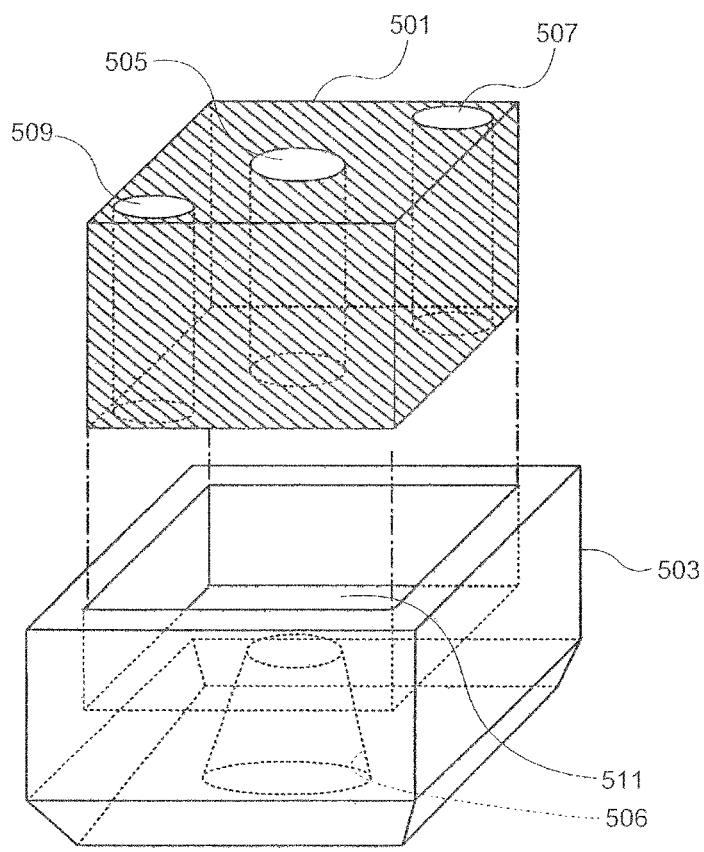
FIG. 5B is an exploded view of the press fitting head shown in FIG. 5A.

FIG. 5A is a schematic diagram showing another example of the press fitting head 103 used in the semiconductor manufacturing apparatus 100. FIG. 5B is an exploded view of the press fitting head shown in FIG. 5A. A press fitting head 103d shown in FIG. 5A includes a press fitting portion 501 and a fixing portion 503 having a fitting portion 511 into which the press fitting portion 501 is fitted.

The press fitting portion 501 directly contacts the semiconductor device 113 and is formed of an elastic member. As with the press fitting head 103b described with reference to FIGS. 3A and 3B, the press fitting portion 501 includes a lower hollow portion 505 and alignment recognition areas 507 and 509. The alignment recognition areas 507 and 509 are opening portions provided in the press fitting portion 501. As with the alignment recognition areas 301 and 303 in FIGS. 3A and 3B, the top view of the opening portions (the alignment recognition areas) 507 and 509 is not limited to circularity. The press fitting portion 501 is partially fitted into the fitting portion 511 of a fixing portion 503 and fixed to the fixing portion 503. The lower hollow portion 505 is coupled with an upper hollow portion 506 of the fixing portion 503 described later.

The fixing portion 503 is substantially similar to the fixing portion 403 of the press fitting head 103 shown in FIGS. 4A and 4B, so that the description thereof is omitted.

In the press fitting head 103d shown in FIGS. 5A and 5B, when the press fitting head 103d sucks and holds the semiconductor device 113, the first alignment mark provided on the surface of the semiconductor device 113 can be imaged by the first imaging unit 109 described below through the alignment recognition areas 507 and 509 and the fixing portion 503 made of the transparent material.

The press fitting heads 103a to 103d used in the semiconductor manufacturing apparatus 100 according to one embodiment of the present invention described with reference to FIGS. 2A to 5B are provided with the alignment recognition area for detecting the first alignment mark provided on the surface of the semiconductor device 113. The first alignment mark can be imaged by the first imaging unit 109 through the alignment recognition area of the press fitting heads 103a to 103d.

A portion of the press fitting heads 103a to 103d in contact with the semiconductor device 113 is an elastic member, so that the portion of the press fitting heads 103a to 103d in contact with the semiconductor device 113 is deformed when the semiconductor device 113 is pressed against and fitted to the fitting surface of the mounting body 115. Therefore, the whole surface area of the semiconductor device 113 can be pressed against the fitting surface of the mounting body 115. Thus, even if the press fitting heads 103a to 103d are not parallel to the fitting surface of the mounting body 115, the corner of the semiconductor device 113 does not rise upward to allow the semiconductor device 113 to be stably pressed against and fitted to the fitting surface of the mounting body 115. Also, even if a foreign matter is jammed between the press fitting heads 103a to 103d and the semiconductor device 113, the portion of the press fitting heads 103a to 103d in contact with the semiconductor device 113 is deformed to allow the damage of the semiconductor device 113 to be reduced, which can improve yield.

The press fitting head 103 (103a, 103b, 103c and 103d) used in the semiconductor manufacturing apparatus 100 according to an embodiment of the present invention has only to include the elastic member in the part where the press fitting head 103 directly contacts the semiconductor device 113 and the alignment recognition area where the first alignment mark provided in the semiconductor device 113 can be detected and is not limited to the press fitting heads 103a to 103d described with reference to FIG. 2A to 5B.

The holding portion 105 holds the press fitting head 103. The holding portion 105 may be formed of metal but not limited thereto.

The first imaging unit 109 is an optical apparatus capturing an image of the surface of the semiconductor device 113 held by the fitting unit 101 and may be a charge coupled device (CCD) camera, for example. The image captured by the first imaging unit 109 is used for recognizing the position of the semiconductor device 113 with respect to the fitting unit 101. The first imaging unit 109 is arranged on a route along which the semiconductor device 113 is moved from a wafer to the mounting body 115. The first imaging unit 109 captures an image on the surface of the semiconductor device 113 including the first alignment mark when the semiconductor device 113 moved by the fitting unit 101 is temporally stopped, and transfers the first image signal corresponding to the captured image to the control unit 107. As described above, the press fitting head 103 of the fitting unit 101 is provided with the alignment mark recognition area allowing the first alignment mark to be detected. Thus, the first alignment mark provided on the surface of the semiconductor device 113 is recognized when the first imaging unit 109 captures an image on the surface of the semiconductor device 113.

The second imaging unit 111 is an optical apparatus capturing an image of the fitting surface of the mounting body 115 and may be a CCD camera, for example. The image captured by the second imaging unit 111 is used to recognize a position where the semiconductor device 113 is fitted to the fitting surface of the mounting body 115. The second imaging unit 111 is arranged above the mounting body 115, captures an image of the fitting surface of the mounting body 115 including the marker (hereinafter referred to as the second alignment mark) provided on the fitting surface of the mounting body 115, and transfers the second image signal corresponding to the acquired image to the control unit 107. The second alignment mark is provided to show a position where the semiconductor device 113 is fitted to the fitting surface of the mounting body 115.

The control unit 107 controls the movement and rotation of the fitting unit 101. In other words, the control unit 107 controls the movement of the semiconductor device 113 held by the fitting unit 101 in the direction of X, Y, and Z axes (front and back directions, left and right directions, and upward and downward directions) and the rotation thereof (on a horizontal plane). The control unit 107 moves the fitting unit 101 onto the semiconductor device 113 separated from a wafer by dicing and controls the fitting unit 101 so as to vacuum-chuck the semiconductor device 113. In other words, the control unit 107 recognizes the position of the semiconductor device 113 by the image unit (CCD camera) which is not shown. And the control unit 107 controls the fitting unit 101 so as to move the fitting unit over the position of the semiconductor device 113, to suck and pick up the semiconductor device 113. The control unit 107 moves the fitting unit 101 holding the picked-out the semiconductor device 113 from over the wafer to over the mounting body 115.

The control unit 107 receives a first image signal corresponding to the image of the surface of the semiconductor device 113 transferred from the first imaging unit 109 while the control unit 107 moves the fitting unit 101 holding the semiconductor device 113 from over the wafer to over the mounting body 115. The control unit 107 detects the position of the first alignment mark provided on the surface of the semiconductor device 113 based on the first image signal transferred from the first imaging unit 109. The control unit 107 receives the second image signal corresponding to the image of the fitting surface of the mounting body 115 transferred from the second imaging unit 111. The control unit 107 detects the position of the second alignment mark provided on the fitting surface of the mounting body 115 based on the second image signal transferred from the second imaging unit 111.

The control unit 107 corrects the position of the semiconductor device 113 held by the fitting unit 101 with respect to the fitting surface of the mounting body 115 so that the semiconductor device 113 mounted on the predetermined position of the mounting body 115 based on the detected first and second alignment marks. In other words, the control unit 107 moves the fitting unit 101 in the direction of X, Y, and Z axes (front and back directions, left and right directions, and upward and downward directions) and rotates the fitting unit 101 (on a horizontal plane) to correct the position of the semiconductor device 113. The control unit 107 corrects the position of the semiconductor device 113 and then moves the fitting unit 101 to mount the semiconductor device 113 at a predetermined position on the fitting surface and controls the fitting unit 101 so as to press and fit the semiconductor device 113 against and to the fitting surface. Thereafter, the control unit 107 releases the vacuum chuck in the fitting unit 101.

According to the semiconductor manufacturing apparatus 100 of one embodiment of the present invention, in the process of moving the semiconductor device 113 to over the mounting body 115, the first imaging unit 109 captures the image of the semiconductor device 113 on which the first alignment mark is provided to correct the position of the semiconductor device 113 with respect to the fitting surface of the mounting body 115 on the basis of the first alignment mark. In other words, in the process of moving the semiconductor device 113 to over the mounting body 115, after the fitting unit 101 holds the semiconductor device 113, the first alignment mark provided on the semiconductor device 113 is recognized through the alignment recognition area provided on the press fitting head 103. This allows the correction of displacement caused by the fitting unit 101 picking out the semiconductor device 113 and moving to fitting position on the mounting body 115 while holding the semiconductor device 113 and allows improvement in accuracy in mounting the semiconductor device 113 with respect to the fitting surface of the mounting body 115.

As described above, the elastic member is included in the part where the press fitting head 103 is in contact with the semiconductor device 113, which allows the whole area of the surface of the semiconductor device 113 to be pressed against the pressing surface of the mounting body 115. Therefore, even if the press fitting heads 103a to 103d described above are not parallel to the fitting surface of the mounting body 115, the corner of the semiconductor device 113 does not rise upward to allow the semiconductor device 113 to be stably pressed against and fitted to the fitting surface of a mounting body 115. If the fitting surface of the mounting body 115 is wide to make it difficult to keep the fitting unit 101 parallel to the fitting surface, which especially increases the effect brought about by the elastic member being included in the part where the press fitting head 103 is in contact with the semiconductor device 113.

The above has described the semiconductor manufacturing apparatus 100 according to one embodiment of the present invention and the press fitting head 103 used in the semiconductor manufacturing apparatus 100 with reference to FIGS. 1 to 5B. However, the semiconductor manufacturing apparatus according to the present invention is not always limited to the configuration of the semiconductor manufacturing apparatus 100 described with reference to FIGS. 1 to 5B.

In the process of picking out the semiconductor device from the wafer and moving the semiconductor device to over the mounting body, for example, an intermediate stage may be provided. The semiconductor device may be temporarily arranged on the intermediate stage after being picked out from the wafer. In this case, the press fitting head according to the present invention which has the alignment recognition area and includes the elastic material in the part contacting the semiconductor device sucks and holds the semiconductor device arranged on the intermediate stage and moves the semiconductor device to over the mounting body. The first alignment mark provided on the semiconductor device is captured by the first imaging unit in the process of the semiconductor device being picked out from the intermediate stage and moved to the mounting body to correct the position of the semiconductor device with respect to the fitting surface of the mounting body 115 on the basis of the first alignment mark.

Another Example

The alignment recognition area for recognizing the first alignment mark provided on the surface of the semiconductor device 113 and the first hollow portion for vacuum-chucking the semiconductor device 113 are separately provided in the press fitting head 103 in the semiconductor manufacturing apparatus 100 described with reference to FIGS. 1 to 5B. However, the alignment recognition area may be doubled as a hollow port ion coupled with the vacuum generator.

Figure 6:
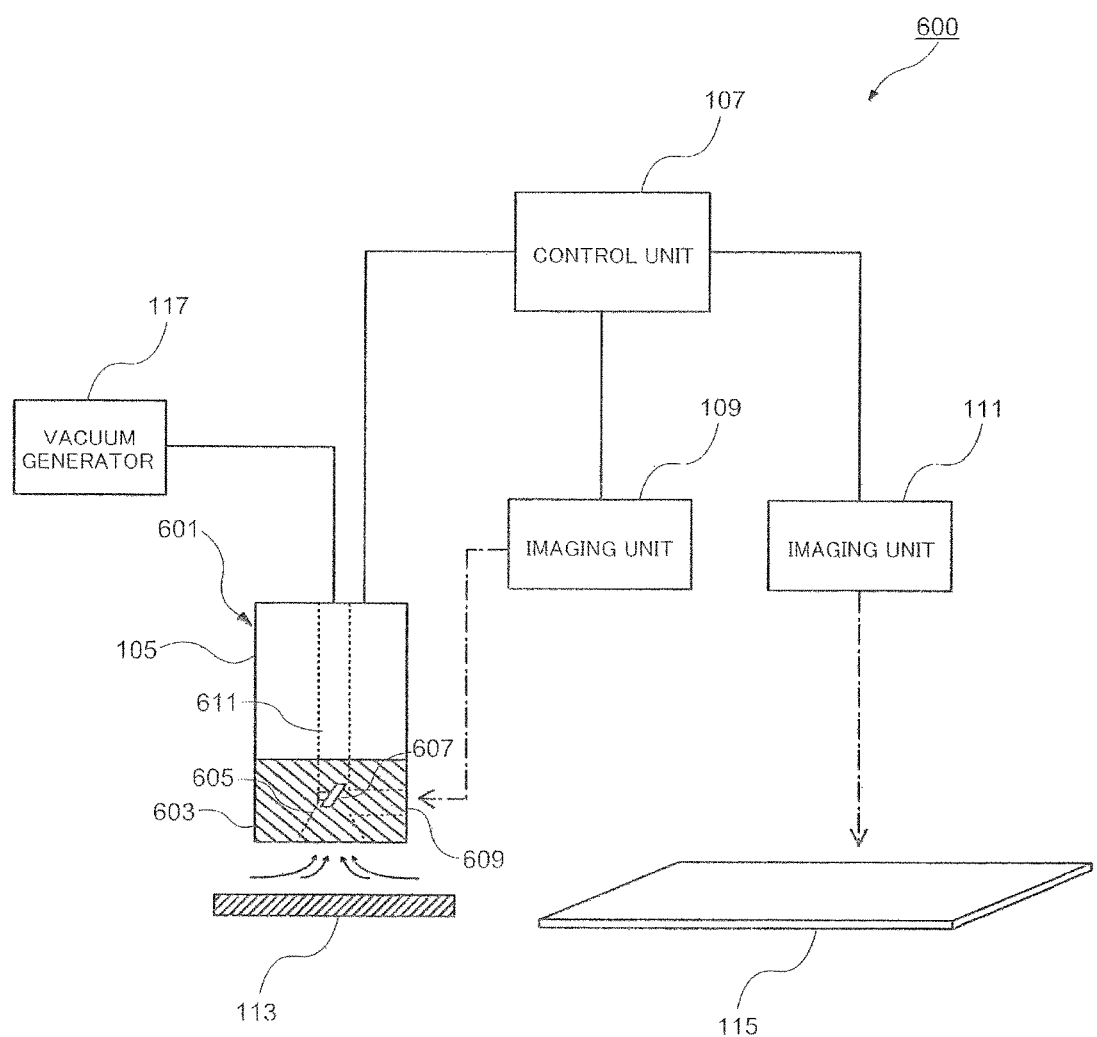
FIG. 6 is a block diagram showing the semiconductor manufacturing apparatus according to another embodiment of the present invention.

FIG. 6 is a block diagram showing another example of a semiconductor manufacturing apparatus 600 according to one embodiment of the present invention. As shown in FIG. 6, the semiconductor manufacturing apparatus 600 includes a fitting unit 601, the control unit 107, the first imaging unit 109, and the second imaging unit 111. In FIG. 6, the same reference numerals are given to the same or similar configuration in the semiconductor manufacturing apparatus 100. In the semiconductor manufacturing apparatus 600, the configuration excluding the fitting unit 601 is the same as the configuration in the semiconductor manufacturing apparatus 100 described with reference to FIGS. 1 to 5B, so that detailed description of the configuration excluding the fitting unit 601 is omitted.

In the semiconductor manufacturing apparatus 600 shown in FIG. 6, as with the fitting unit 101 of the semiconductor manufacturing apparatus 100, the fitting unit 601 takes the semiconductor device 113 out of the diced wafer and holds it. The fitting unit 601 comprises a press fitting head 603 which sucks and holds the semiconductor device 113 and the holding portion 105 fixed to the press fitting head 603. The press fitting head 603 includes an elastic member in the part contacting the semiconductor device 113. It is desirable that the elastic member has conductivity. In the semiconductor manufacturing apparatus 600, the press fitting head 603 is presumed to be made of an elastic member as a whole. The press fitting head 603 includes a first opening portion 605 passing through the press fitting head 603, a mirror 607 provided in the first opening portion 605, and a second opening portion 609 which is coupled with the first opening portion 605 and used for imaging. The holding portion 105 is provided with a hollow portion 611 which is coupled with the vacuum generator 117 at one end thereof and is coupled with the first opening portion 605 at another end thereof.

A first optically readable alignment mark provided on the surface of the semiconductor device 113 contacting the press fitting head 603 can be detected through the first opening portion 605 provided on the press fitting head 603. The first alignment mark can be imaged by setting the mirror 607 provided on the first opening portion 605 so that the image on the surface of the semiconductor device 113 including the first alignment mark is reflected in the direction of the second opening portion 609 used for imaging and by capturing the reflected image from the second opening portion 609 by the first imaging unit 109.

In the semiconductor manufacturing apparatus 600, the mirror 607 does not always have to be arranged on the first opening portion 605 of the press fitting head 603 but may be arranged in a position where an image on the surface of the semiconductor device including the first alignment mark can be captured. One or more mirrors 607 may be arranged. The second opening portion 609 for imaging does not always have to be arranged on the press fitting head 603, but may be arranged in the holding portion 105. In this case, the second opening portion 609 arranged in the holding portion 105 may be coupled with the hollow portion 611.

If the semiconductor device is minute, the press fitting head sucking and holding the semiconductor device is designed to be small in size. A small press fitting head may make it difficult to provide separately the hollow portion coupled with the vacuum generator and the alignment recognition area for recognizing the first alignment mark. In the fitting unit 601 of the semiconductor manufacturing apparatus 600, the first opening portion 605 serving as the alignment recognition area is coupled with the vacuum generator to allow a minute semiconductor device 113 to be sucked and held without another hollow port ion coupled with the vacuum generator being provided on the press fitting head 603 and the first alignment mark to be captured through the first opening port ion 605 and the second opening port ion 609.

The semiconductor manufacturing apparatus according to the present invention and the press fitting head used in the semiconductor manufacturing apparatus are not limited to the embodiments described above, and it is to be understood that the embodiments can be changed without departing from the scope and spirit of the present invention. The above examples describe the press fitting head including the elastic material in the part contacting the semiconductor device in consideration of damage of the semiconductor device and adhesiveness of the semiconductor device with respect to the mounting body, but if a foreign matter is not jammed between the press fitting head and the semiconductor device to allow the fitting surface of the mounting body to be kept parallel to the whole surface of the semiconductor device, the elastic material does not need to be included in the part contacting the semiconductor device so long as the press fitting head has the alignment recognition area. In that case, for example, the press fitting head may be formed of sintered hard alloy or ceramics.

What is claimed is:

1. A press fitting head comprising:
   an elastic member in a part where the press fitting head contacts a semiconductor device; and
   an alignment mark recognition area for detecting an optically readable marker provided on a surface to be contacted of the semiconductor device.

2. The press fitting head according to claim 1, wherein:
   the elastic member has a notch portion; and
   the alignment mark recognition area coincides with the notch portion.

3. The press fitting head according to claim 1, wherein:
   the elastic member has an opening portion; and
   the alignment mark recognition area coincides with the opening portion.

4. The press fitting head according to claim 3, wherein the opening portion is coupled with a vacuum generator.

5. The press fitting head according to claim 1, further comprising a transparent portion configured to fix the elastic member.

* * * * *